US 6,727,437 B2

(12) United States Patent
Tandy (10) Patent No.: US 6,727,437 B2
(45) Date of Patent: *Apr. 27, 2004

(54) NON-CONTINUOUS CONDUCTIVE LAYER FOR LAMINATED SUBSTRATES

(75) Inventor: Patrick W. Tandy, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 10/210,219

(22) Filed: Aug. 1, 2002

(65) Prior Publication Data

US 2002/0189851 A1 Dec. 19, 2002

Related U.S. Application Data

(63) Continuation of application No. 09/634,064, filed on Aug. 8, 2000, now Pat. No. 6,429,385.

(51) Int. Cl.⁷ .............................. H05K 1/16; H05K 1/03
(52) U.S. Cl. ..................... 174/260; 174/254; 174/255; 174/257; 361/760; 361/777
(58) Field of Search .................. 174/250, 254, 174/255, 260, 261, 268, 257; 361/792, 795, 760, 748, 737, 777; 257/778, 737

(56) References Cited

U.S. PATENT DOCUMENTS

| 3,357,099 A | 12/1967 | Nagy et al. |
| 4,567,545 A | 1/1986 | Mettler, Jr. |
| 4,772,936 A | 9/1988 | Reding et al. |
| 5,061,988 A | 10/1991 | Rector |
| 5,218,172 A | 6/1993 | Seidel |
| 5,253,415 A | 10/1993 | Dennis |
| 5,552,567 A | 9/1996 | Peterson et al. |
| 5,773,764 A | 6/1998 | von Vajna |
| 5,831,218 A | 11/1998 | Hu et al. |
| 5,915,755 A | 6/1999 | Gochnour et al. |
| RE36,325 E | 10/1999 | Corbett et al. |
| 5,979,044 A | 11/1999 | Sumi et al. |
| 6,013,541 A | 1/2000 | Tan et al. |
| 6,201,299 B1 * | 3/2001 | Tao et al. .................. 257/701 |
| 6,204,559 B1 | 3/2001 | Lin et al. |
| 6,239,380 B1 | 5/2001 | Drussel et al. |
| 6,246,015 B1 * | 6/2001 | Kim ......................... 174/261 |
| 6,310,298 B1 * | 10/2001 | Barrett et al. ............... 174/250 |
| 6,429,385 B1 | 8/2002 | Tandy |

* cited by examiner

*Primary Examiner*—Kamand Cuneo
*Assistant Examiner*—J B Patel
(74) *Attorney, Agent, or Firm*—Killworth, Gottman, Hagan & Schaeff LLP (57) ABSTRACT

Methods, memory devices, module boards and systems are disclosed utilizing a non-continuous conductive layer in their circuit board as opposed to a substrate having a continuous length of metal such as copper from one end to the other. By ensuring that a non-continuous conductive layer is no longer present in a substrate, deformation and warping of the substrate or circuit board can be reduced. This can reduce or prevent future errors in processing from occurring due to the tight tolerance required in processing of circuit boards.

42 Claims, 7 Drawing Sheets

NON-CONTINUOUS CONDUCTIVE LAYER FOR LAMINATED SUBSTRATES

CROSS REFERENCE TO RELATED APPLICATIONS

This application is a continuation of U.S. Pat. No. 6,429, 385, filed Aug. 08, 2000, and is related to U.S. patent application Ser. No. 09/968,564 filed Oct. 01, 2001.

FIELD OF THE INVENTION

The present invention relates to the field of circuit board and substrate manufacture and, more particularly, to a non-continuous conductive layer for laminated substrates.

BACKGROUND OF THE INVENTION

Circuit boards and printed circuit boards (PCB) are commonly used in electronic devices of today. Many electronic devices, such as motherboards, memory devices, video adaptors, network cards and the like are created using circuit boards.

Generally, a circuit board is a flat piece of insulating material such as fiberglass, epoxy or phenolic resin, on which electrical components are mounted and interconnected to form a circuit. The flat piece of insulating material forms the substrate. A laminated circuit board is a circuit board in which a conductive layer is laminated onto an insulating layer.

Figure 1A:
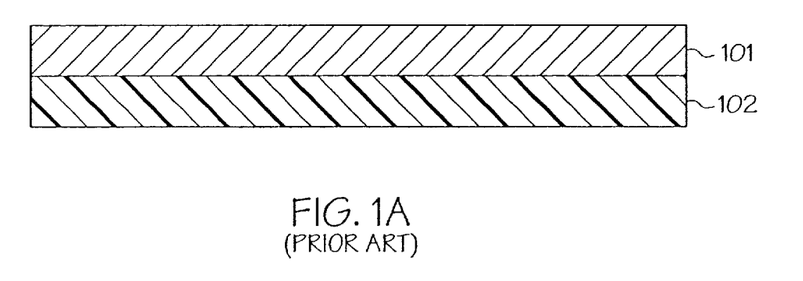
FIG. 1A is a cross sectional illustration of a typical laminated circuit board substrate having a copper layer laminated onto a fiberglass layer.
Figure 1B:
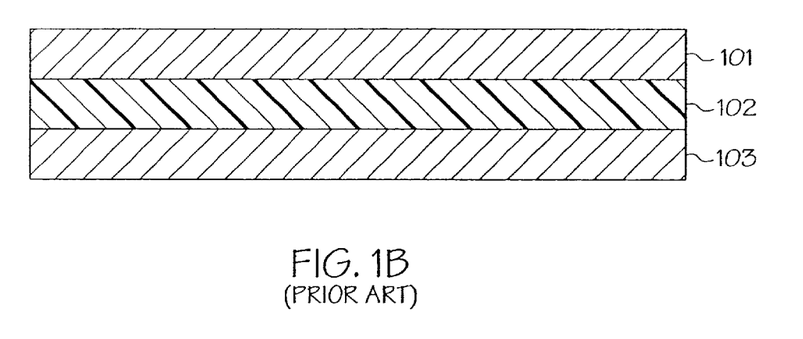
FIG. 1B is a cross sectional illustration of a typical laminated circuit board substrate having a fiberglass layer sandwiched between two metal layers.

Circuit boards or PCBs have multiple conductive paths or interconnects to provide electrical connections among circuit components on the board. FIG. 1A shows a typical laminated circuit board having a copper layer 101 laminated onto a fiberglass layer 102. This circuit board or substrate has a thickness of 0.010 inches, a length of 7.2 inches and a width of 1 inch. FIG. 1B shows a typical laminated circuit board having a fiberglass layer 102 sandwiched between two metal layers 101, 103 such as copper. This circuit board has a thickness of 0.012 inches, a length of 7.2 inches and a width of 1 inch. Circuit boards are commonly used for devices such as memory devices, module boards, video cards, sound cards and the like.

The connections between components on a circuit board are typically created by using photolithography. The circuit pattern is drawn, photographed, and reduced to a negative having the desired final size. This negative is called the photomask or mask. Light is passed through the mask onto a substrate having a conductive layer that has been coated with a photoresistive material. Where light strikes the photoresistive material, its composition is changed. In the next step, the photoresistive material not affected by light is washed off. Finally, the circuit board is exposed to an etching solution that eats away the parts of the conductive layer not protected by the photoresistive material, creating the desired circuit pattern on the surface of the circuit board.

Standard substrates are used for circuit boards and devices such as memory devices. Minor defects or deformations in these substrates or circuit boards can have a significant impact on further processing of the circuit board which includes attaching components, such as integrated circuits, to the circuit board. Processing requires strict tolerances and even minor deformations can damage equipment or render a circuit board useless. For example, even a $\frac{1}{16}$"-$\frac{1}{8}$" bow in a substrate for a dual in line memory module (DIMM) can cause problems in processing the module.

Figure 2:
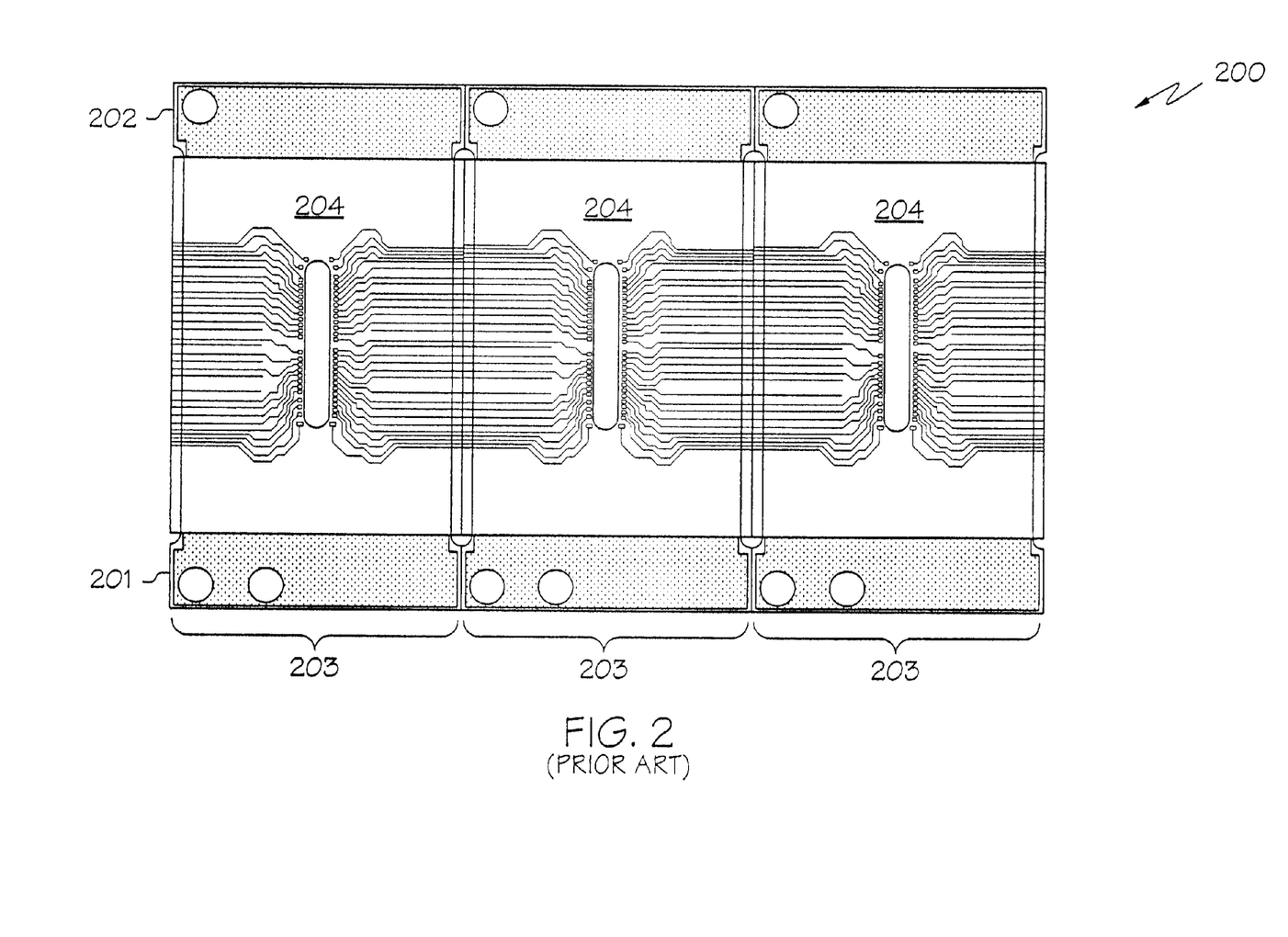
FIG. 2 is an illustration of a typical circuit board.

FIG. 2 shows a typical circuit board after it has been patterned. After a circuit board is patterned, circuit boards typically include lengths of conductive material along each edge of the circuit board, from one end to the other end. These lengths of conductive material are called rails and are shown in FIG. 2 as a first rail 201 and a second rail 202. The rails 201 and 202 are formed as a result of the patterning. The conductive material can be a metal such as copper. Conductive materials have a property that once they are deformed or bent, they "remember" that deformation. For example, once a piece of copper is bent a certain way, the piece will have a tendency to bend that certain way even after it is bent a different way. Because of the rails, these circuit boards or substrates have a tendency to remember any deformation that they are subjected to. Circuit boards encounter thermal cycling during processing which causes the expansion and contraction of the substrate. This can result in circuit boards that are warped or deformed.

What is needed is a way to reduce warping or deforming of circuit boards during processing.

SUMMARY OF THE INVENTION

A method for fabricating a circuit board having a non-continuous conductive layer is disclosed. A conductive layer is laminated onto an insulating layer. A pattern is etched on the conductive layer to eliminate continuous lengths of conductive material.

A method for fabricating a circuit board is disclosed. A conductive layer is formed over an insulating layer. The conductive layer has a first rail area, a pattern area and a second rail area. The pattern area of the conductive layer is patterned. Conductive material from the first and second rail areas is removed.

A module board is disclosed. The module board includes a circuit board, a pattern and rails. The circuit board has a conductive layer of a conductive material laminated to an insulating layer. The pattern is etched onto the substrate. The rail is located along a first and second length of the substrate. The rail is an area not etched from the pattern. Conductive material is at least partially removed from the rails to remove continuous lengths of conductive material from the circuit board.

Other methods, systems and devices are disclosed.

DETAILED DESCRIPTION OF THE INVENTION

The term "patterning" refers to one or more steps that result in the removal of selected portions of layers. The patterning process is also known by the names photomasking, masking, photolithography and microlithography. The term "circuit board" refers to a flat piece of insulating material, such as epoxy or phenolic resin, on which electrical components are mounted and interconnected.

As stated earlier, FIG. 2 is an example of a standard circuit board 200 used for memory devices such as dual in line memory modules (DIMMs). The circuit board includes a first rail 201, a second rail 202, a number of sites 203 and a patterned area 204. A rail is an area along the edge of a circuit board. The rails 201 and 202 do not generally contain conductive paths, bonding pads or the like. Thus, the rails 201 and 202 do not get etched and conductive material is not removed from the rails 201 and 202. The rails 201 and 202 include a large amount of conductive material such as copper. The conductive material stretches from one end of the substrate to the other. FIG. 2 only shows 3 die sites or sites, however any number of sites such as 12 can be on a single circuit board. A site is a location where an integrated circuit is attached to the substrate, typically by soldering. The patterned area 204 is the area where electrical interconnects and bonding pads are formed by etching away conductive material. The patterned area 204 is adjacent to the first rail 201 and the second rail 202. The circuit board 200 of FIG. 2 is susceptible to deformation and warping due to expansion and contraction of the circuit board during thermal cycling. This circuit board has a tendency to remember any deformation that it is subjected to and can cause errors in processing.

Figure 3A:
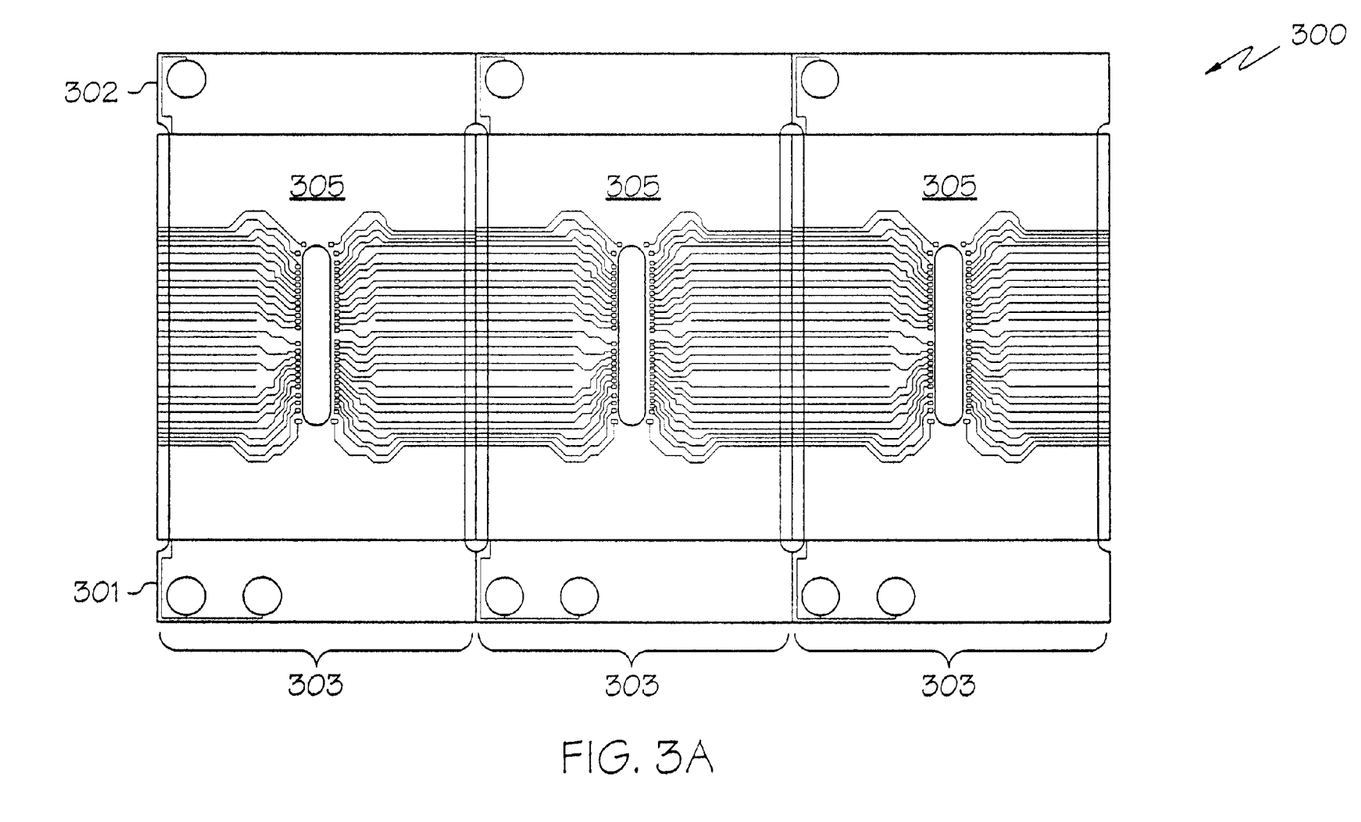
FIG. 3A is an illustration of a laminated circuit board according to the present invention.

FIG. 3A is a laminated circuit board 300 according to one embodiment of the invention. The circuit board 300 includes a first rail 301, a second rail 302, a number of sites 303 and a patterned area 305. The patterned area 305 is adjacent to the first rail 301 and the second rail 302. Even though there are only 3 sites 303 shown in FIG. 3, the invention is not limited to a specific number of sites. The first rail 301 and the second rail 302 have had all conductive material removed and thus, no conductive material remains. The patterned area 305 is the area where electrical interconnects, conductive traces, and bonding pads are formed by etching away conductive material. A conductive material commonly used is copper, however other conductive materials may be used in the circuit board. By having the conductive material removed from the rails 301 and 302, this circuit board 300 has a reduced tendency to warp or deform.

Figure 3B:
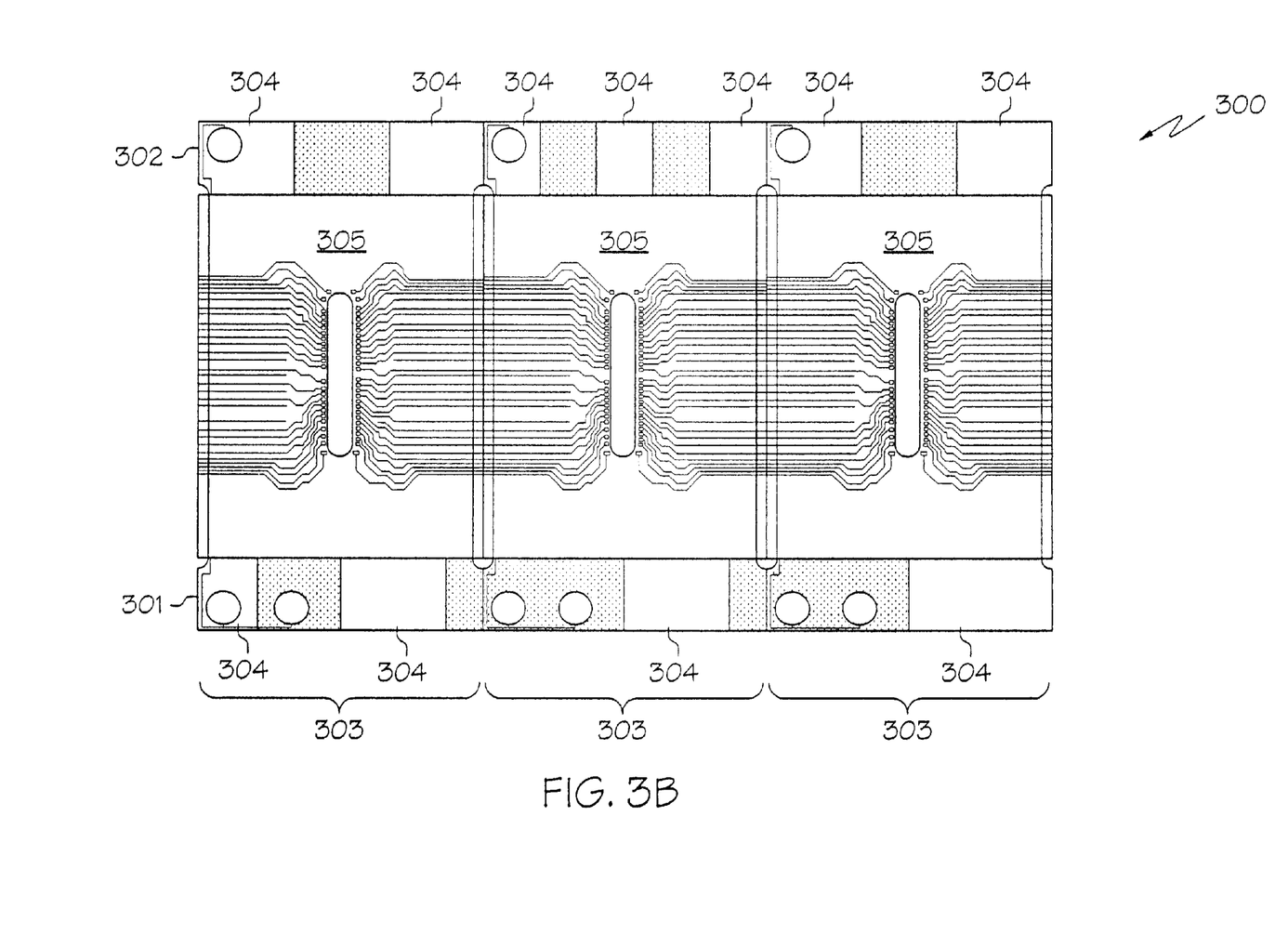
FIG. 3B is an illustration of a laminated circuit board according to the present invention.

FIG. 3B is a laminated circuit board 300 according to one embodiment of the invention. The circuit board 300 includes a first rail 301, a second rail 302, a number of sites 303 and a patterned area 305. The patterned area 305 is adjacent to the first rail 301 and the second rail 302. Even though there are only 3 sites 303 shown in FIG. 3, the invention is not limited to a specific number of sites. The first rail 301 and the second rail 302 have had gaps 304 of conductive material removed and thus, no continuous lengths of conductive materials remain. Rather, the first and second rails 301, 302 include segments of conductive material between the gaps 304. The patterned area 305 is the area where electrical interconnects and bonding pads are formed by etching away conductive material. A conductive material commonly used is copper, however other conductive materials may be used in the circuit board. By having the gaps 304 of conductive material removed from the rails 301 and 302, this circuit board 300 has a reduced tendency to warp or deform.

Figure 4A:
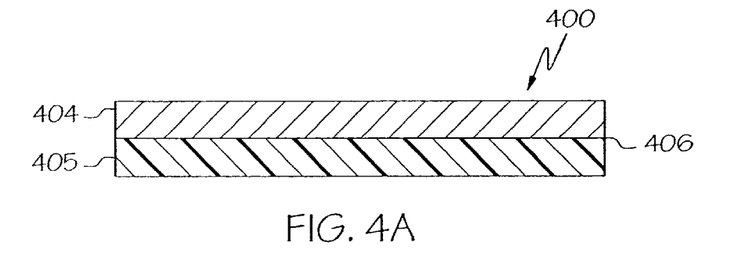
FIG. 4A is an illustration of a side view of a module board according to the present invention.

FIG. 4A is a side view of a module board 400 according to one embodiment of the invention. The module board 400 has a top 406 and is fabricated on a laminated circuit board having an insulating layer 405 and a conductive layer 404 laminated onto the insulating layer. For the purposes of describing and defining the present invention, a module board is any electronic device made from a circuit board such as video cards, sound cards, memory devices, mother boards, network cards and the like. The conductive layer 404 is made from a conductive material such as copper. The insulating layer 405 is made from an insulating material such as fiberglass.

Figure 4B:
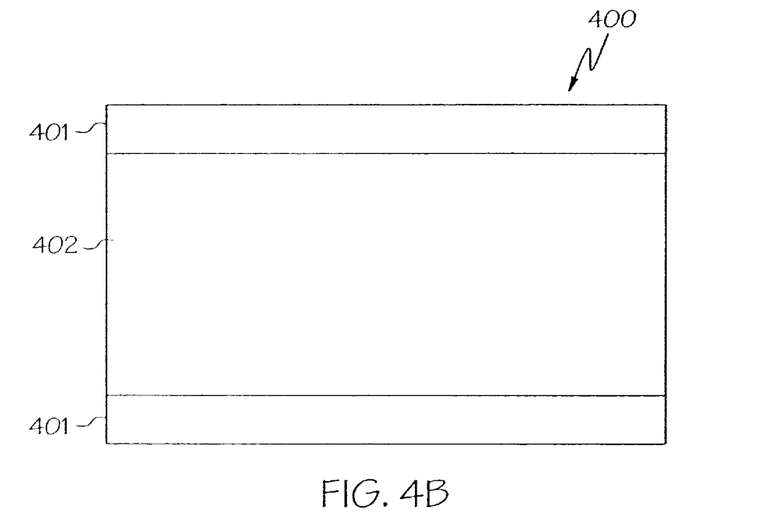
FIG. 4B is an illustration of a top view of a module board according to the present invention.

FIG. 4B is top view of a module board 400 according to one embodiment of the invention. The module board 400 can be any number of electronic devices such as video cards, sound cards, network cards and the like. For this embodiment, the module board 400 includes a pattern area 402 in between two rail areas 401. Alternate embodiments may have one rail or no rails. The pattern area 402 is etched onto the substrate of the module board 400. The pattern creates the desired conductive connections, leads and pads on the board 400. A mask or photomask may be used to etch the pattern so as to remove conductive material. After the pattern area 402 is etched, rail areas 401 along each edge remain and the rail areas 401 have not had conductive material removed during patterning. The rail areas 401 are partially etched or completely etched so that no continuous lengths of conductive material remains from one end of the board 400 to the other. To remove continuous lengths of conductive material from the rail areas 401, all of the conductive material in the rail may be removed or gaps of removed conductive material in the rail could be created leaving segments of conductive material between the gaps. The module board 400 can be further processed by connecting integrated circuits and devices while having a reduced tendency to deform or warp compared to boards having continuous lengths of such a conductive material.

Figure 4C:
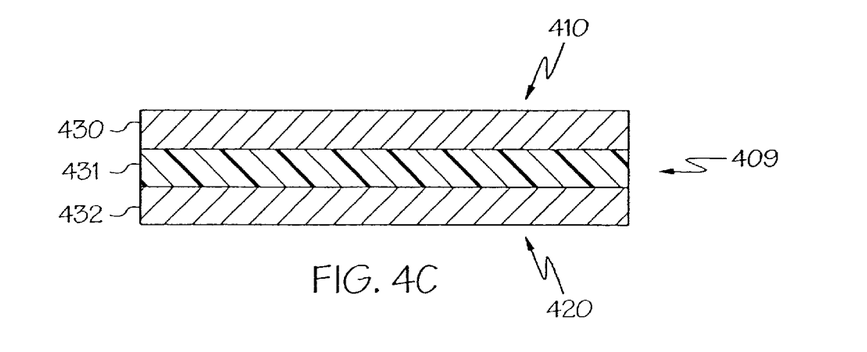
FIG. 4C is an illustration of a side view of a dual sided module board according to the present invention.

FIG. 4C is a side view of a dual sided module board 409 according to one embodiment of the invention. The module board 409 has a top 410 and a bottom 420. The module board 409 is fabricated on a laminated circuit board comprised of a top conductive layer 430 laminated onto an insulating layer 431 laminated onto a bottom conductive layer 432. For the purposes of describing and defining the present invention, a module board is any electronic device made from a circuit board such as video cards, sound cards, memory devices, mother boards, network cards and the like. The conductive layers 430 and 432 are made from a conductive material such as copper. The insulating layer 431 is made from an insulating material such as fiberglass.

Figure 4D:
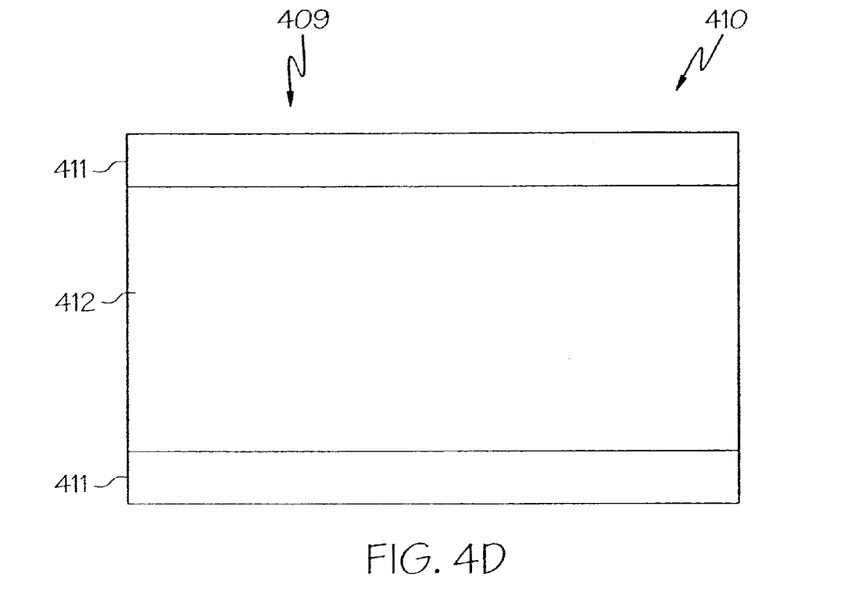
FIG. 4D is an illustration of a top view of a dual sided module board according to the present invention.

FIG. 4D is top view of a dual sided module board 409 according to one embodiment of the invention. The module board 409 can be any number of electronic devices such as video cards, sound cards, network cards and the like. The module board 409 includes a pattern area 412 in between two rail areas 411. The pattern 412 is etched onto the substrate of the module board 409. The pattern creates the desired conductive connections, leads and pads on the board 409. A mask or photomask may be used to etch the pattern so as to remove conductive material. After the pattern 412 is etched, rails 411 along each edge remain and the rails 411 have not had conductive material removed during patterning. The rails 411 are partially etched or completely etched so that no continuous lengths of conductive material remains from one end of the board 409 to the other. To remove continuous lengths of conductive material from the rails 411, all of the conductive material in the rail may be removed or gaps of removed conductive material in the rail could be created. The module board 409 can be further processed by connecting integrated circuits and devices while having a reduced tendency to deform or warp compared to boards having continuous lengths of such a conductive material.

Figure 4E:
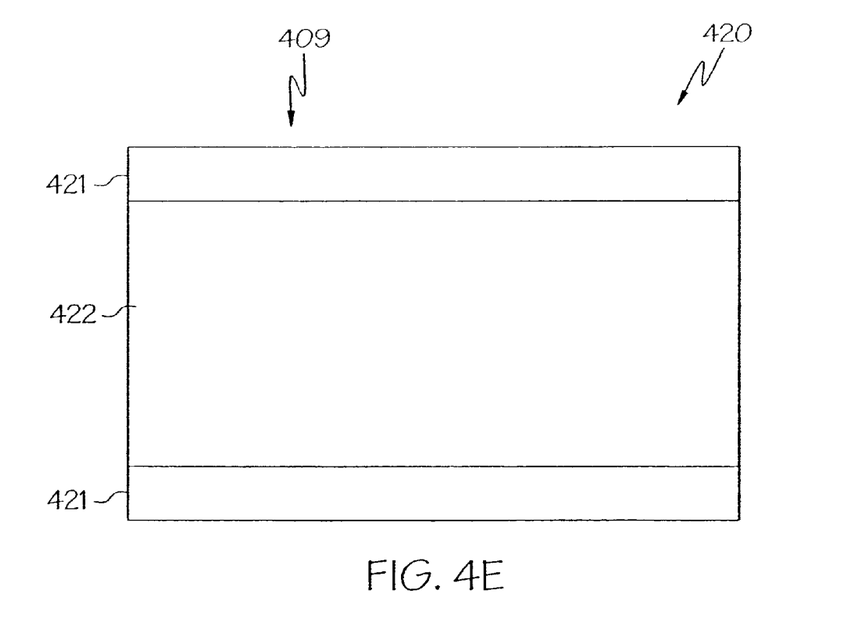
FIG. 4E is an illustration of a bottom view of a dual sided module board according to the present invention.

FIG. 4E is a bottom view of a dual sided module board 409 according to one embodiment of the invention. The module board 409 includes a pattern area 422 in between two rail areas 421. The pattern 422 is etched onto the substrate of the module board 409. The pattern creates the desired conductive connections, leads and pads on the board 409. A mask or photomask may be used to etch the pattern so as to remove conductive material. After the pattern 422 is etched, rails 421 along each edge remain and the rails 421 have not had conductive material removed during patterning. The rails 421 are partially etched or completely etched so that no continuous lengths of conductive material remains from one end of the board 409 to the other. To remove continuous lengths of conductive material from the rails 421, all of the conductive material in the rail may be removed or gaps of removed conductive material in the rail could be created. The module board 409 can be further processed by connecting integrated circuits and devices while having a reduced tendency to deform or warp compared to boards having continuous lengths of such a conductive material.

Figure 5:
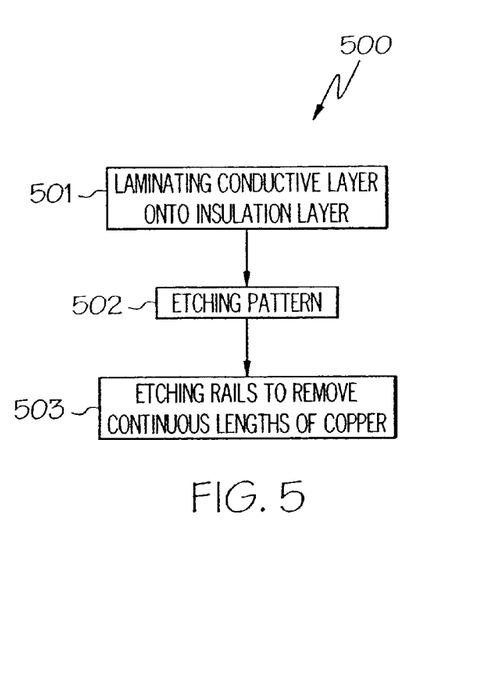
FIG. 5 is a method for fabricating a circuit board having a non-continuous conductive layer according to the present invention.

FIG. 5 is a method 500 for fabricating a circuit board having a non-continuous conductive layer according to one embodiment of the invention. A conductive layer is laminated onto an insulating layer at block 501. The conductive layer can be composed of a conductive material such as a metal such as copper. The insulating layer can be of a material such as fiberglass. A pattern is then etched into the conductive layer of the circuit board at block 502. This removes some of conductive material and creates the electrical connections and bonding or connecting pads on the circuit board. However, rails have not had any conductive material removed and contain conductive material stretching from one end of the circuit board to the other. The rails are etched to remove conductive material from the rails 503. The conductive material may be completely removed from the rails or sections or gaps of conductive material may be removed so that no continuous lengths of conductive material remain.

Figure 6:
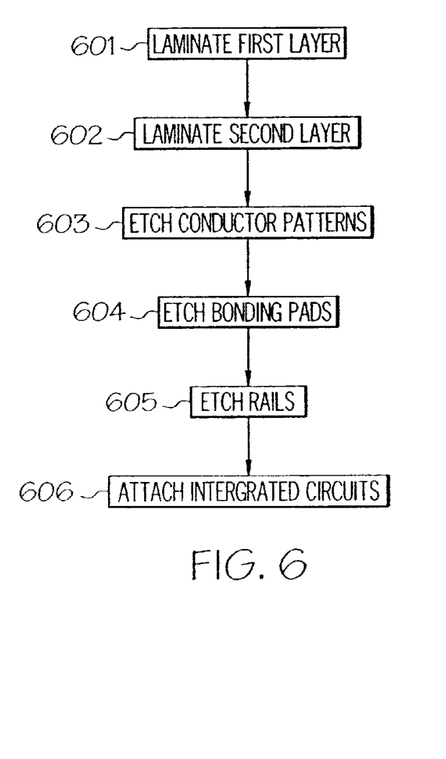
FIG. 6 is a method for fabricating an electronic device according to the present invention.

FIG. 6 is a method 600 for creating an electronic device according to one embodiment of the invention. A first conductive layer is laminated onto an insulating layer at block 601. A second conductive layer is laminated onto the opposite side of the insulating layer at block 602. Conductor patterns for a number of die sites are etched into both conductive layers at block 603. Bonding pads are also etched into the conductive layers 604. Rails having continuous lengths of conductive material remain on the edges of both conductive layers because they have not had conductive material removed from etching. The rails are then etched to remove the conductive material, at least partially such that no continuous lengths of conductive material remain on the rails 605. A continuous length of material is a strip of material that completely goes from one end of the circuit board to the other. The circuit board then continues processing and integrated circuits are attached to the die sites 606.

Figure 7:
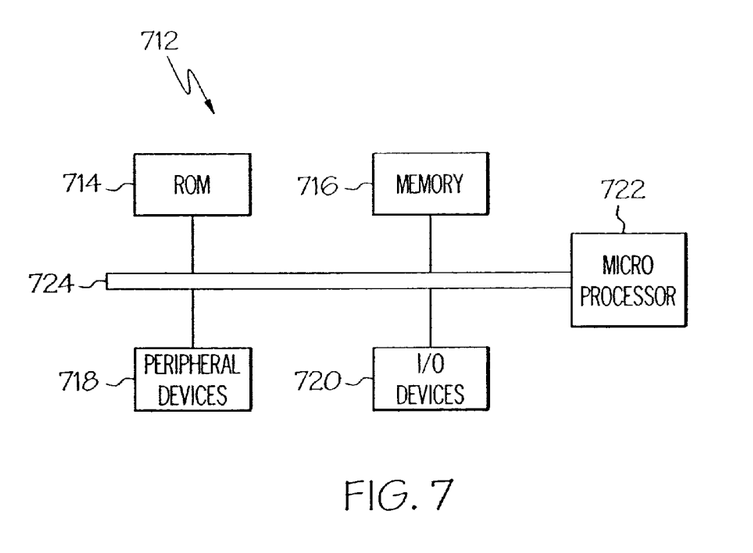
FIG. 7 is a block diagram of a typical computer system in which the invention may be used.

FIG. 7 is an illustration of a computer system 712 that can use and be used with embodiments of the present invention. As will be appreciated by those skilled in the art, the computer system 712 would include ROM 714, mass memory 716, peripheral devices 718, and I/O devices 720 in communication with a microprocessor 722 via a data bus 724 or another suitable data communication path. These devices can be fabricated according with the various embodiments of the present invention.

Having described the invention in detail and by reference to preferred embodiments thereof, it will be apparent that modifications and variations are possible without departing from the scope of the invention defined in the appended claims. For example, support and guidance structures used in packaging often have continuous layers of conductive material. Gaps or portions of conductive material can be removed from support and guidance structures to reduce deformations caused by the memory effect.

What is claimed is:

1. A circuit board comprising:
    a substrate having a length, a width, a first surface, and a second surface;
    a pattern of conductive traces formed on said first surface of said substrate; and
    a first rail extending along said length of said substrate generally adjacent to a first edge thereof, said first rail comprising a conductive material electrically isolated from said pattern of conductive traces and arranged such that no continuous length of said conductive material within said first rail extends across substantially the entire length of said substrate.

2. The circuit board according to claim 1, wherein said first rail extends along said first surface of said substrate.

3. The circuit board according to claim 1, wherein said first rail extends along said second surface of said substrate.

4. The circuit board according to claim 1, further comprising:
    a second rail extending along said length of said substrate on said first surface generally adjacent to a second edge thereof, said second rail comprising a conductive material electrically isolated from said pattern of conductive traces and arranged such that no continuous length of said conductive material within said second rail extends across substantially the entire length of said substrate.

5. The circuit board according to claim 1, further comprising:
    a second rail extending along said length of said substrate on said second surface generally adjacent to a second edge thereof, said second rail comprising a conductive material electrically isolated from said pattern of conductive traces and arranged such that no continuous length of said conductive material within said second rail extends across substantially the entire length of said substrate.

6. The circuit board according to claim 1, wherein said conductive material within said first rail comprises a plurality of segments of conductive material separated by gaps.

7. The circuit board according to claim 6, wherein said gaps are arranged such that said first rail is nonconductive when measured across said length of said substrate.

8. The circuit board according to claim 1, wherein said conductive material within said first rail is arranged such that subsequent thermal cycling sufficient to cause the expansion and contraction of said substrate will not cause deformation of said substrate due to the memory of said conductive material.

9. The circuit board according to claim 1, wherein said conductive material within said first rail is arranged such that said conductive material will not have a tendency to deform due to memory of prior deformations during subsequent thermal cycling of said circuit board.

10. A circuit board comprising:
a substrate having a length, a width, a first surface, and a second surface;
a plurality of conductive paths formed on said first surface of said substrate; and
a rail extending along said length of said substrate generally adjacent to one edge thereof, said rail comprising a conductive material electrically isolated from each of said plurality of conductive paths and arranged such that there is at least one gap in said conductive material within said rail.

11. The circuit board according to claim 10, wherein said conductive material within said first rail is arranged such that subsequent thermal cycling sufficient to cause the expansion and contraction of said substrate will not cause deformation of said substrate due to the memory of said conductive material.

12. The circuit board according to claim 10, wherein said conductive material within said first rail is arranged such that said conductive material will not have a tendency to deform due to memory of prior deformations during subsequent thermal cycling of said circuit board.

13. A circuit board comprising:
a substrate having a length, a width, a first surface, and a second surface;
a pattern of conductive traces formed on said first surface of said substrate;
a first rail extending along said length of said substrate on said first surface generally adjacent to a first edge thereof, said first rail comprising a conductive material electrically isolated from said pattern of conductive traces and arranged such that no continuous length of said conductive material within said first rail extends across substantially the entire length of said substrate; and
a second rail extending along said length of said substrate on said first surface generally adjacent to a second edge thereof, said second rail comprising a conductive material electrically isolated from said pattern of conductive traces and arranged such that no continuous length of said conductive material within said second rail extends across substantially the entire length of said substrate.

14. The circuit board according to claim 13, wherein said conductive material within said first and second rails each comprise a plurality of segments of conductive material separated by gaps.

15. The circuit board according to claim 14, wherein said gaps within said first rail are arranged such that said first rail is nonconductive when measured across said length of said substrate, and said gaps within said second rail are arranged such that said second rail is nonconductive when measured across said length of said substrate.

16. The circuit board according to claim 13, wherein said conductive material within said first and second rails is arranged such that subsequent thermal cycling sufficient to cause the expansion and contraction of said substrate will not cause deformation of said substrate due to the memory of said conductive material.

17. The circuit board according to claim 13, wherein said conductive material within said first and second rails is arranged such that said conductive material will not have a tendency to deform due to memory of prior deformations during subsequent thermal cycling of said substrate.

18. A memory device comprising:
a circuit board having a length, and a width;
a site comprising a pattern of conductive traces formed onto said circuit board; and
a rail extending along at least a portion of said length of said circuit board generally adjacent to an edge thereof, said rail comprising segments of conductive material electrically isolated from said pattern of conductive traces, wherein said segments of conductive material are separated by gaps of insulating material.

19. A circuit board comprising:
a substrate having a length, a width, a first surface, and a second surface;
a first rail extending along said length of said substrate generally adjacent to a first edge thereof, said first rail comprising a conductive material arranged such that no continuous length of said conductive material within said first rail extends across substantially the entire length of said substrate;
a second rail extending along said length of said substrate generally adjacent to a second edge thereof, said second rail comprising a conductive material arranged such that no continuous length of said conductive material within said second rail extends across substantially the entire length of said substrate; and
a pattern of conductive traces formed on said first surface of said substrate between said first and second rails, said pattern of conductive traces electrically isolated from said conductive material within said first and second rails.

20. The circuit board according to claim 19, wherein said conductive material within said first and second rails comprises a plurality of segments of conductive material separated by gaps.

21. The circuit board according to claim 20, wherein said gaps within said first rail are arranged such that said first rail is nonconductive when measured across said length of said substrate, and said gaps within said second rail are arranged such that said second rail is nonconductive when measured across said length of said substrate.

22. The circuit board according to claim 19, wherein said conductive material within said first and second rails is arranged such that subsequent thermal cycling sufficient to cause the expansion and contraction of said substrate will not cause deformation of said substrate due to the memory of said conductive material.

23. The circuit board according to claim 19, wherein said conductive material within said first and second rails is arranged such that said conductive material will not have a tendency to deform due to memory of prior deformations during subsequent thermal cycling of said circuit board.

24. A circuit board comprising:
a substrate having a length, a width, a first surface, and a second surface;
a first rail extending along said length of said substrate generally adjacent to a first edge thereof, said first rail comprising a conductive material arranged such that no continuous length of said conductive material within said first rail extends across substantially the entire length of said substrate;
a second rail extending along said length of said substrate generally adjacent to a second edge thereof, said second rail comprising a conductive material arranged such that no continuous length of said conductive material within said second rail extends across substantially the entire length of said substrate; and a repeating pattern of conductive traces and die sites formed on said first surface of said substrate between said first and second rails aligned in series across said length of said substrate, each of said repeating pattern of conductive traces and die sites electrically isolated from said conductive material within said first and second rails.

25. A circuit board comprising:

a substrate including a first layer of conductive material laminated to a second layer of insulating material;

a first rail extending along said length of said substrate generally adjacent to a first edge thereof, said first rail defined by a first strip of said insulating material that is not laminated over by said conductive material; and a pattern of conductive traces formed on said first layer of said substrate said pattern of conductive traces defined by removed portions of said conductive material, wherein said pattern of conductive traces are electrically isolated from said first rail.

26. A circuit board comprising:

a substrate including a first layer of conductive material laminated to a second layer of insulating material;

a first rail extending along said length of said substrate generally adjacent to a first edge thereof, said first rail defined by a first strip of said insulating material that is not laminated over by said conductive material;

a second rail extending along said length of said substrate generally adjacent to a second edge thereof, said second rail defined by a second strip of said insulating material that is not laminated over by said conductive material; and a pattern of conductive traces formed on said first layer of said substrate between said first and second rails, said pattern of conductive traces defined by removed portions of said conductive material, wherein said pattern of conductive traces are electrically isolated from said first and second rails.

27. A circuit board comprising:

a substrate including a first layer of conductive material laminated to a second layer of insulating material;

a first rail extending along said length of said substrate generally adjacent to a first edge thereof, said first rail defined by a first strip of said insulating material that is not laminated over by said conductive material;

a second rail extending along said length of said substrate generally adjacent to a second edge thereof, said second rail defined by a second strip of said insulating material that is not laminated over by said conductive material; and a repeating pattern of conductive traces and die sites formed on said first layer of said substrate between said first and second rails aligned in series along said length of said substrate, each of said repeating pattern of conductive traces and die sites defined by removed portions of said conductive material and electrically isolated from said first and second rails.

28. A circuit board comprising:

a substrate including a first layer of conductive material laminated to a second layer of insulating material;

a first rail extending along said length of said substrate generally adjacent to a first edge thereof, said first rail comprising a first strip having at least one gap in said conductive material within said first strip;

a second rail extending along said length of said substrate generally adjacent to a second edge thereof, said second rail comprising a second strip having at least one gap in said conductive material within said second strip; and a pattern of conductive traces formed on said first layer of said substrate between said first and second rails, said pattern of conductive traces electrically isolated from said first and second rails and defined by removed portions of said conductive material.

29. The circuit board according to claim 28, wherein:

said at least one gap of said first strip is defined by a removed portion of said conductive material over said insulating material within said first rail; and said at least one gap of said second strip is defined by a removed portion of said conductive material over said insulating material within said second rail.

30. The circuit board according to claim 28, wherein:

said at least one gap of said first strip is positioned along said first rail such that no continuous length of said conductive material within said first rail extends across substantially the entire length of said substrate; and said at least one gap of said second strip is positioned along said second rail such that no continuous length of said conductive material within said second rail extends across substantially the entire length of said substrate.

31. The circuit board according to claim 28, wherein:

said conductive material within said first and second rails is arranged such that subsequent thermal cycling sufficient to cause the expansion and contraction of said substrate will not cause deformation of said substrate due to the memory of said conductive material.

32. The circuit board according to claim 28, wherein:

said at least one gap within said first rail comprises a plurality of gaps arranged such that said conductive material within said first rail comprises a plurality of segments of conductive material, each segment of conductive material spaced from an adjacent segment of conductive material by at least one gap, and said at least one gap within said second rail comprises a plurality of gaps arranged such that said conductive material within said second rail comprises a plurality of segments of conductive material, each segment of conductive material spaced from an adjacent segment of conductive material by at least one gap.

33. The circuit board according to claim 32, wherein said gaps formed in said conductive material are arranged such that said first rail is nonconductive when measured across said length of said substrate, and said second rail is nonconductive when measured across said length of said substrate.

34. A circuit board comprising:

a substrate having a first layer of a first conductive material laminated to a top side of an insulating layer and a second layer of a second conductive material laminated to a bottom side of said insulating layer;

a first pattern of conductive traces formed from said first layer of said first conductive material defined by removed portions of said first conductive material; and a first rail extending generally adjacent to a first edge of said substrate arranged to span substantially the entire length thereof, said first rail electrically isolated from said first pattern of conductive traces and comprising at least one gap formed in said first conductive material.

35. The circuit board according to claim 34, further comprising a second rail extending generally adjacent to a second edge of said substrate, said second rail electrically isolated from said first pattern of conductive traces and comprising at least one gap formed in said first conductive material.

36. A circuit board according to claim 34 further comprising:
- a second site comprising a second pattern of conductive traces formed from said second layer of said second conductive material; and
- a second rail extending generally adjacent to a first edge of said second conductive material, said second rail electrically isolated from said first and second patterns of conductive traces and comprising at least one gap formed in said second conductive material, wherein said first rail is further electrically isolated from said second pattern of conductive traces.

37. A circuit board according to claim 34 further comprising:
- a second site comprising a second pattern of conductive traces formed from said second layer of said second conductive material, wherein said first pattern of conductive traces is further electrically isolated from said second pattern of conductive traces;
- a second rail extending generally adjacent to a second edge of said substrate, said second rail electrically isolated from said first and second patterns of conductive traces and comprising at least one gap formed in said first conductive material;
- a third rail extending generally adjacent to said first edge of said substrate, said third rail electrically isolated from said first and second patterns of conductive traces and comprising at least one gap formed in said second conductive material; and
- a fourth rail extending generally adjacent to said second edge of said second conductive material, said fourth rail electrically isolated from said first and second patterns of conductive traces and comprising at least one gap formed in said second conductive material.

38. The circuit board according to claim 37, wherein:
said first, second, third, and fourth rails are arranged such that subsequent thermal cycling sufficient to cause the expansion and contraction of said substrate will not cause deformation of said substrate due to the memory of said first, second, third, and fourth rails.

39. A circuit board comprising:
- a substrate having a length and a width, said substrate comprising:
  - a first conductive layer;
  - a second conductive layer; and
  - an insulating layer having a top side and a bottom side, said first conductive layer laminated to said top side and said second conductive layer laminated to said bottom side;
- a first site comprising a first pattern of conductive traces formed from said first conductive layer of said substrate;
- a second site comprising a second pattern of conductive traces formed from said second conductive layer of said substrate;
- a first generally rectangular rail extending along said length of said substrate generally adjacent to a first edge thereof, said first generally rectangular rail electrically isolated from said first and second patterns of conductive traces by gaps formed in said first conductive layer such that said first generally rectangular rail is nonconductive when measured across said length of said substrate;
- a second generally rectangular rail extending along said length of said substrate generally adjacent to a second edge thereof, said second generally rectangular rail electrically isolated from said first and second patterns of conductive traces by gaps formed in said first conductive layer such that said second generally rectangular rail is nonconductive from said first end to said second end when measured across said length of said substrate;
- a third generally rectangular rail extending along said length of said substrate generally adjacent to said first edge thereof, said third generally rectangular rail electrically isolated from said first and second patterns of conductive traces by gaps formed in said second conductive layer such that said third generally rectangular rail is nonconductive from said first end to said second end when measured across said length of said third substrate; and
- a fourth generally rectangular rail extending along said length of said substrate generally adjacent to said second edge thereof, said fourth generally rectangular rail electrically isolated from said first and second patterns of conductive traces by gaps formed in said second conductive layer such that said fourth generally rectangular rail is nonconductive from said first end to said second end when measured across said length of said substrate.

40. A system comprising:
a substrate comprised of conductive material laminated to an insulating material, wherein said conductive material includes a pattern of conductive traces defining at least one site and at least one rail area that is electrically isolated from said pattern of conductive traces, wherein said substrate has sufficient insulating material within each of said at least one rail area such that subsequent thermal cycling sufficient to cause the expansion and contraction of said substrate will not cause deformation of said substrate due to the memory of said conductive material.

41. A computer system comprising:
a processor; and
at least one memory device coupled to the processor comprising:
- a circuit board having a length, a width and a thickness;
- a plurality of die sites formed onto the circuit board wherein the sites are aligned in series across the length of the circuit board; and
- at least one rail comprising a conductive material, each rail positioned generally adjacent to a respective edge of said length of said circuit board defining a strip therealong, wherein each rail is conductively isolated from each die site and formed such that no continuous length of conductive material extends across substantially said length of the circuit board.

42. A computer system comprising:
a one processor;
a memory module board communicably coupled to said processor, said memory module board comprising:
- a substrate having a length, a width, a first surface, and a second surface;

a pattern of conductive traces formed on said first surface of said substrate;

a first rail extending along said length of said substrate on said first surface generally adjacent to a first edge thereof, said first rail comprising a conductive material electrically isolated from said pattern of conductive traces and arranged such that no continuous length of said conductive material within said first rail extends across substantially the entire length of said substrate; and a second rail extending along said length of said substrate on said first surface generally adjacent to a second edge thereof, said second rail comprising a conductive material electrically isolated from said pattern of conductive traces and arranged such that no continuous length of said conductive material within said second rail extends across substantially the entire length of said substrate.

* * * * *

UNITED STATES PATENT AND TRADEMARK OFFICE
CERTIFICATE OF CORRECTION

PATENT NO. : 6,727,437 B2
DATED : April 27, 2004
INVENTOR(S) : Tandy

It is certified that error appears in the above-identified patent and that said Letters Patent is hereby corrected as shown below:

Column 12,
Line 39, "insulating material within each of said at least one rail area such that subsequent thermal cycling sufficient to cause the expansion and contraction of said substrate will not cause deformation of said substrate due to the memory of said conductive material." should read -- gaps in said conductive material exposing said insulating material within each of said at least one rail area such that subsequent thermal cycling sufficient to cause expansion and contraction of said substrate will not cause deformation of said substrate due to the memory of said conductive material within said at least one rail area. --

Signed and Sealed this

Seventh Day of December, 2004

JON W. DUDAS
*Director of the United States Patent and Trademark Office*